US006531862B1

(12) United States Patent  (10) Patent No.: US 6,531,862 B1
Stanley  (45) Date of Patent: Mar. 11, 2003

(54) HIGH PERFORMANCE CURRENT SENSOR USING LOW COST CURRENT TRANSFORMER ARRAYS

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 75 days.

(21) Appl. No.: 09/748,900

(22) Filed: Dec. 27, 2000

Related U.S. Application Data
(60) Provisional application No. 60/173,940, filed on Dec. 30, 1999.

(51) Int. Cl.[7] .................................................. G01R 1/00
(52) U.S. Cl. ........................ 324/127; 324/114; 324/115
(58) Field of Search ........................ 324/117 R, 117 H, 324/127, 126, 122, 133, 115, 114; 340/664, 660; 336/84, 200

(56) References Cited

U.S. PATENT DOCUMENTS 4,626,777 A * 12/1986 Ainsworth .............. 324/117 R
4,831,327 A * 5/1989 Chenier et al. ............. 324/126
5,552,700 A * 9/1996 Tanabe et al. .......... 324/117 H
5,642,041 A * 6/1997 Berkcan ................. 324/117 R

* cited by examiner

Primary Examiner—Kamand Cuneo
Assistant Examiner—Tung X. Nguyen
(74) Attorney, Agent, or Firm—Brinks Hofer Gilson & Lione

(57) ABSTRACT

The present invention provides a current sensor for an electrical device. The sensor includes a housing, a conductor routed through the housing, an array of current transducers coupled to the conductor, and a current level signal generated by the current transducers. The conductor is adapted to be connected in a current path of the electrical device. Each of the current transducers has an output lead. The current level signal is provided on said output leads. The output leads are electrically connected to a printed circuit board. An external connector is electrically connected to the printed circuit board through a cable. A plurality of shields are used adjacent to the current transducers. The array of current transducers can be a single layer array, a multiple layer array, or a planar array.

29 Claims, 7 Drawing Sheets

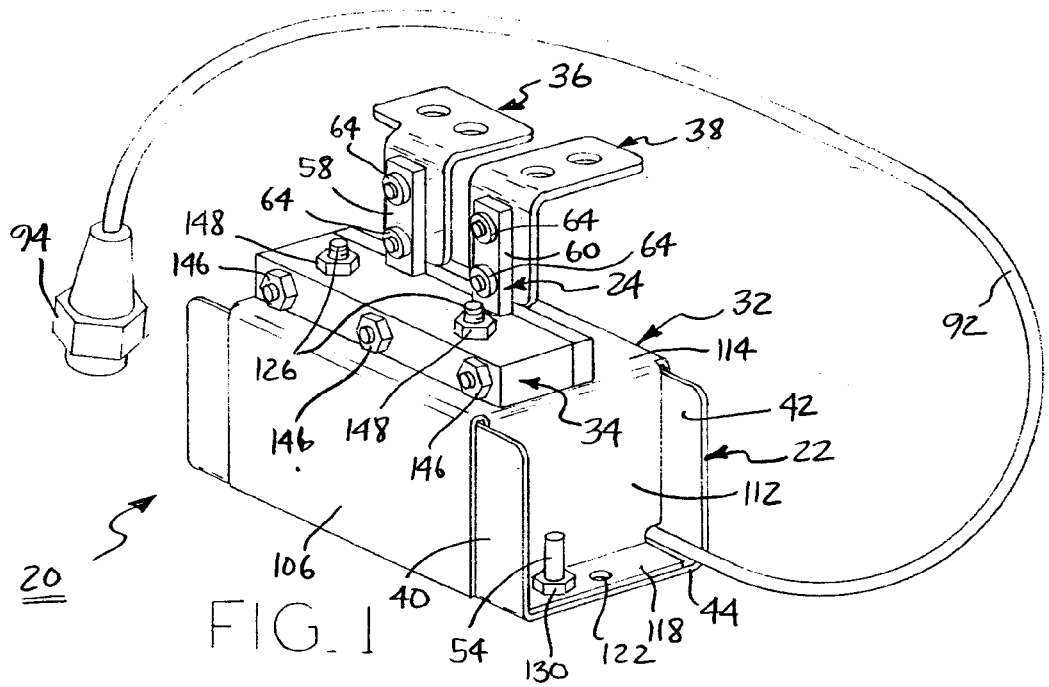
FIG_1
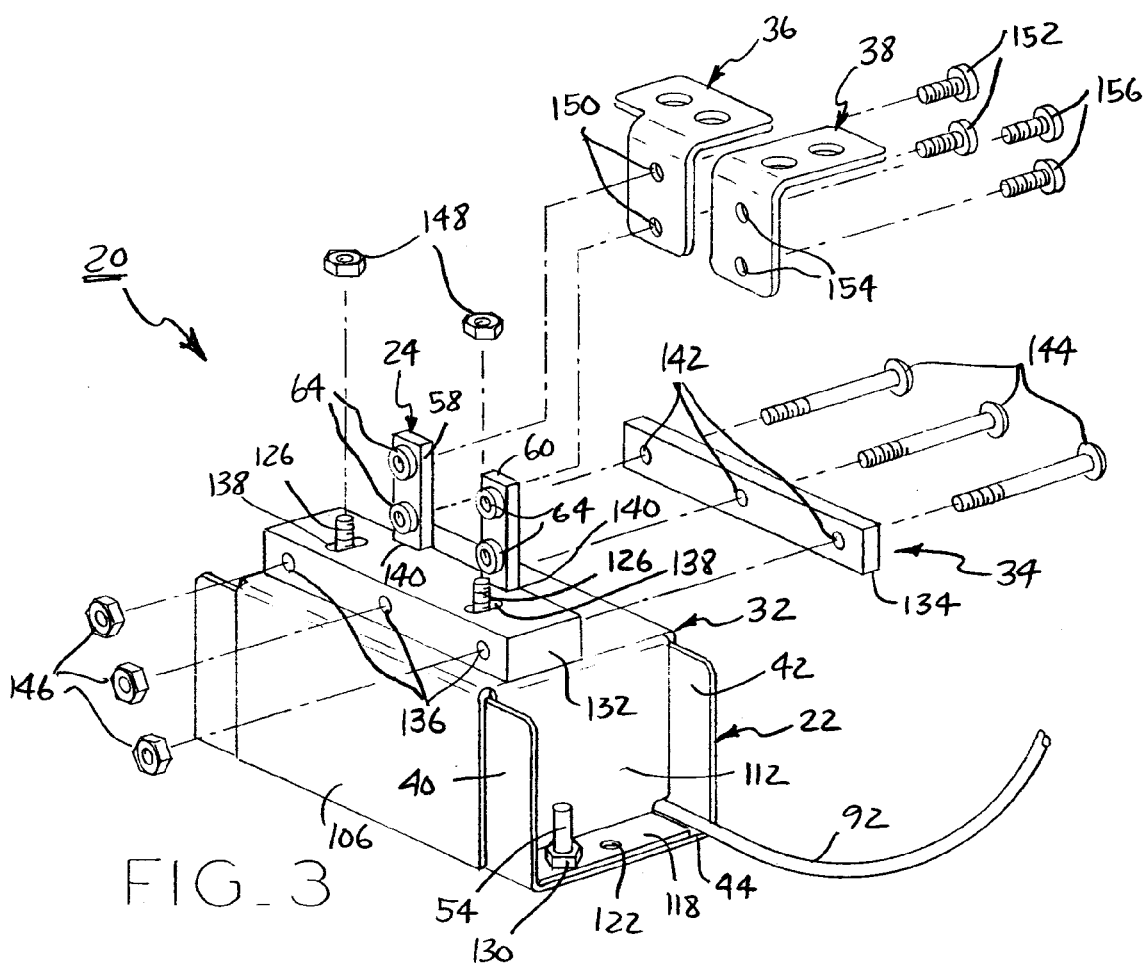
FIG_3

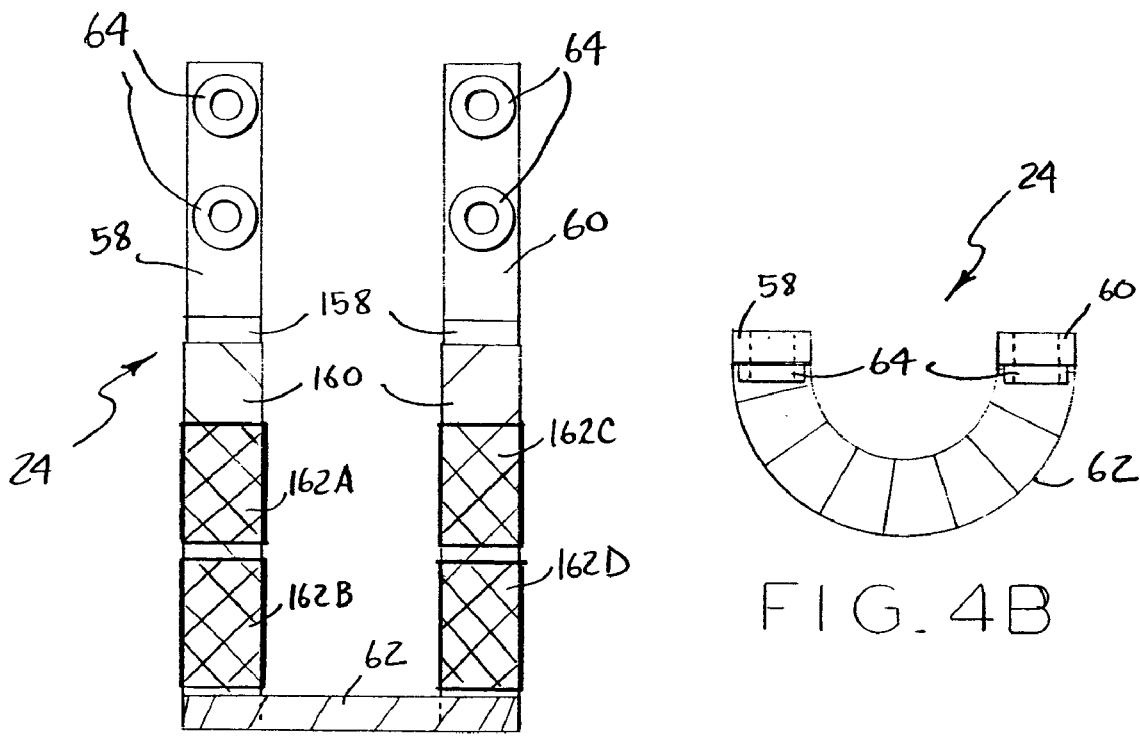
FIG_4A
FIG_4B
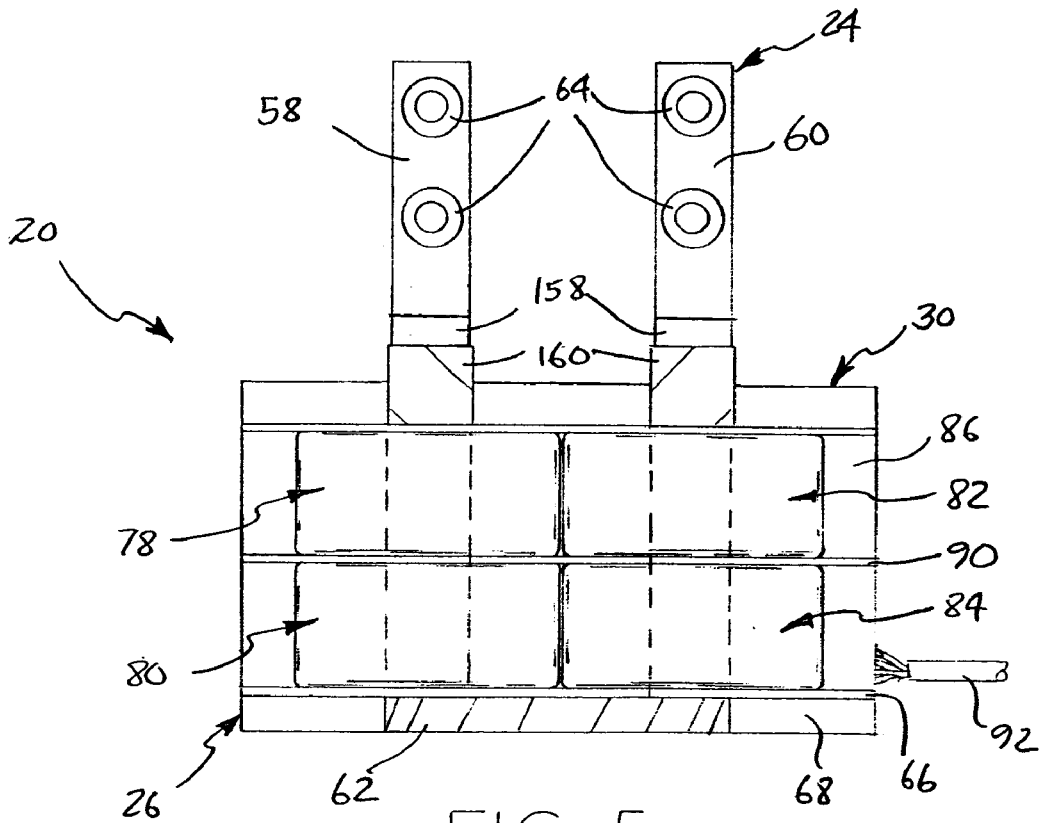
FIG_5

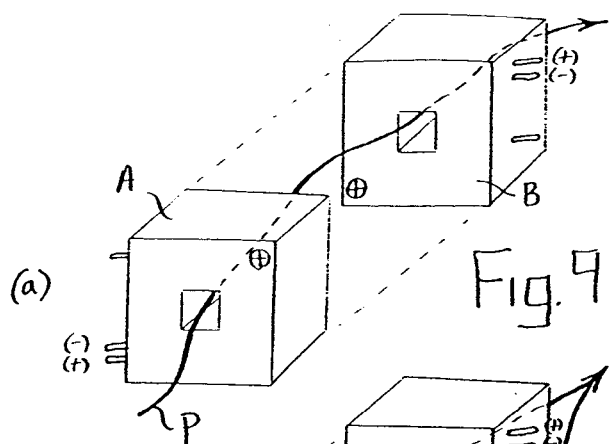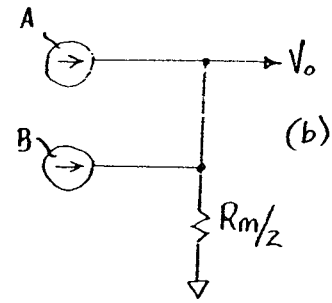
Fig. 9
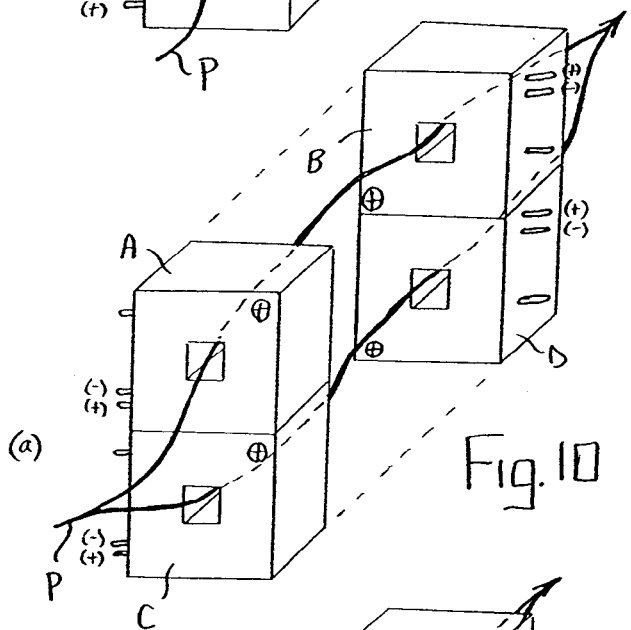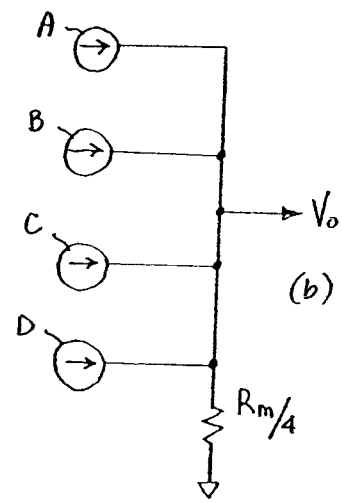
Fig. 10
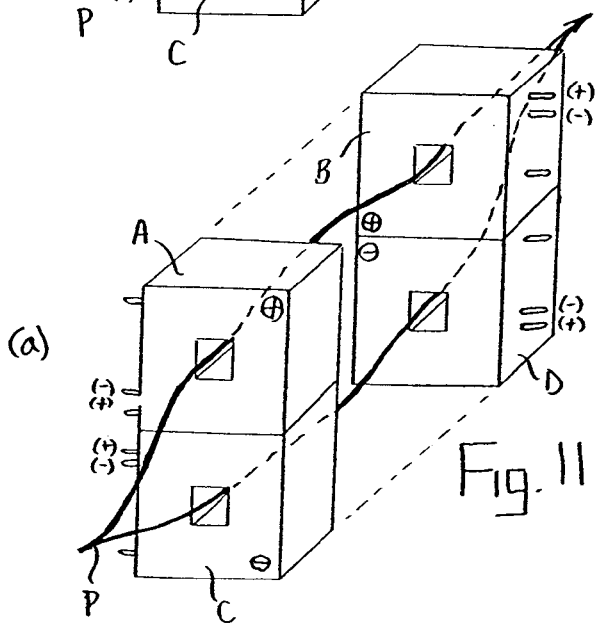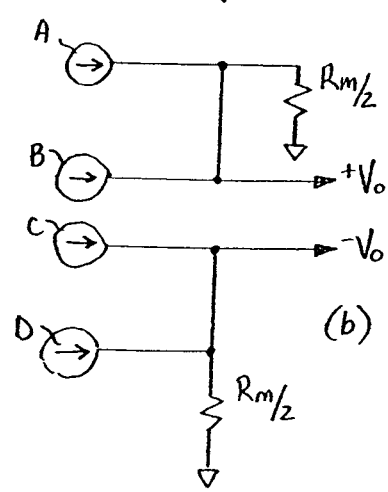
Fig. 11

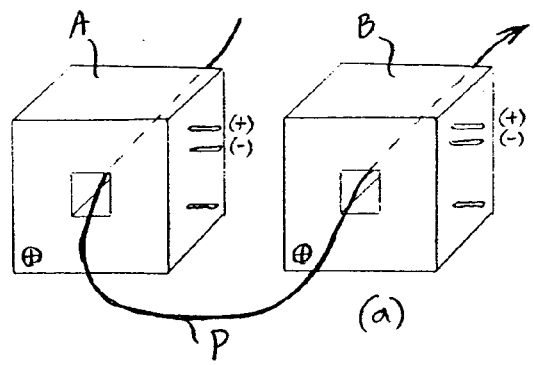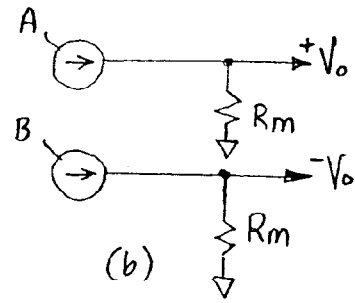
Fig. 12
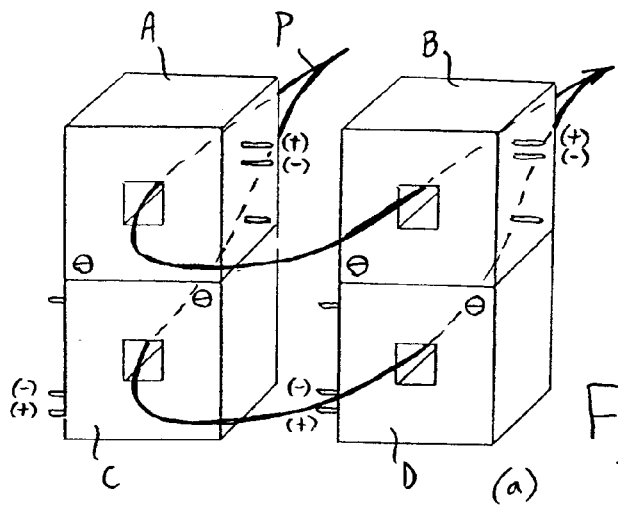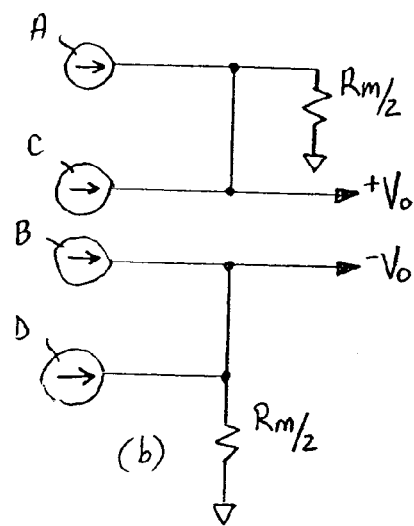
Fig. 13
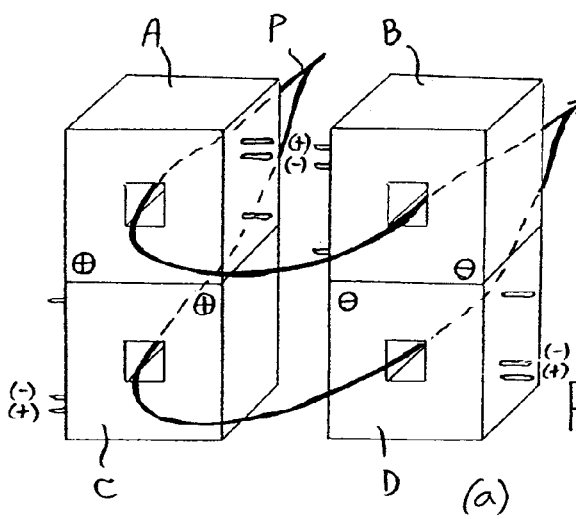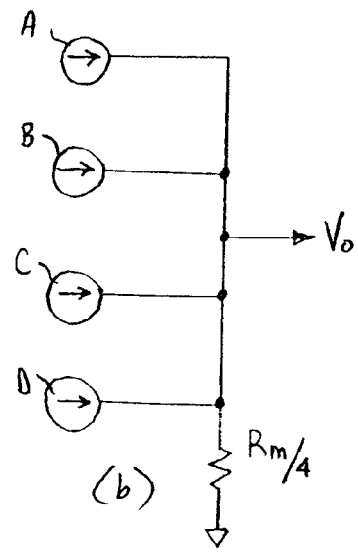
Fig. 14

HIGH PERFORMANCE CURRENT SENSOR USING LOW COST CURRENT TRANSFORMER ARRAYS

This application claims priority of U.S. Provisional Patent Application Ser. No. 60/173,940, filed Dec. 30, 1999.

BACKGROUND OF THE INVENTION

1. Field of the Invention

The present invention relates generally to current measurement devices, and more particularly to a current sensor using low cost current transformer arrays.

2. Description of the Related Art

Current measurements are critical to the control of magnetic resonance imaging (MRI) gradient coil signals. Conventional current sensing devices limit the dynamic range and accuracy of the images. Traditionally, current transformers/transducers or CTs have been hand selected to make a marginal product possible. A current transducer that used to cost $30 has escalated to over $300.

The best conventional current sensor is based on fluxgate design principals and costs $500 each. These sensors are plagued, however, by a substantial clock noise signal that is typically at 10 KHz and in the closed-loop bandwidth of the gradient system. It would be possible to use an external passive sensor with a fluxgate sensor. This solution, however, would cost nearly $550 per axis, and is not economically feasible.

Most galvanically isolated current sensors are based on some use of magnetics to sense the flux around the output leads of the gradient amplifier, and as such they are also susceptible to large magnetic fields that are present in the MRI environment. A typical maximum stray field specification is 200 Gauss. Unfortunately, all of the hi-mu materials used in current transducers (fluxgate included) saturate at about 50 Gauss. Clearly, whatever is used must have added shielding to reduce the external field to well under 50 Gauss near the current transducers.

The next best conventional current transducer is based on the closed-loop application of Hall sensors. A large turn-count secondary is wound onto a core through which the primary is threaded (few turns). The Hall sensor is placed into the gap of the core and its output is amplified and fed through the secondary. The secondary current is sensed with a resistor across which the output signal is produced. The feedback is poled in a way that minimizes the flux sensed by the Hall sensor. This condition occurs when the secondary current times the secondary turns count is equal to the primary current times the primary turns count. A DC coupled transformer is thus formed.

When the loop gain diminishes at high frequencies, a conventional transformer remains with the secondary current being driven into the sense resistor. The bandwidth of such a system is intrinsically large with a typical 3 dB being beyond 250 KHz.

At low frequencies, the necessary core size is minimized by the flux zeroing nature of the system. The major limitation to performance of the system is the limited signal-to-noise (S/N) of any known Hall sensor today. The result is a sensor which exhibits at best about twice the desired noise level of the current transducer.

Virtually all current transducer manufacturers use current sensors made by Asahi Kasei Electronics (AKE) of Japan. Most of the sensors are made for high volume applications which do not have the demands of MRI current transducers. AKE does not make custom devices for current transducer manufacturers. Accordingly, such manufacturers are limited to AKE's high volume sensors, with the option to sort them for desired performance characteristics.

Within the market of current transducers there are graduations of sensor quality and quantity. Some high volume applications have resulted in low-cost ($3–$10) current transducers of magnetic construction which is not as self-shielding as the highest performance types. The frequency response of these transducers is also more likely to contain a dip in the frequency region where the closed loop system is crossing over to the passive open loop high frequency system. Providing that the distortion and frequency response of these less expensive types can be eliminated or controlled, it would be possible to use them in a manner which results in superior stray field rejection and better S/N ratio.

Many of the lower cost current transducers are somewhat smaller in physical size than the larger and more expensive transducers. This gives them a slight edge in S/N ratio as the field around a current carrying wire is greatest very near to the wire.

SUMMARY OF THE INVENTION

The present invention provides a current sensor for an electrical device which uses a plurality of current transducers in an array to provide a current measurement with lower noise levels and lower magnetic susceptibility. The orientation and number of the current transducers in the array affects the S/N ratio of the sensor. The sensor includes a housing, a conductor routed through the housing, an array of current transducers coupled to the conductor, and a current level signal generated by the current transducers. The conductor is adapted to be connected in a current path of the electrical device. Each of the current transducers has an output lead which carries the current level signal from the transducer. The output leads are electrically connected to a printed circuit board. A connector is electrically connected to the printed circuit board through a cable. A plurality of Faraday shields are disposed adjacent the current transducers to attenuate the field from the operating environment. The array of current transducers can be a single layer array, a multiple layer array, or a planar array.

BRIEF DESCRIPTION OF THE DRAWINGS

The above mentioned and other features of this invention, and the manner of attaining them, will become more apparent and the invention itself will be better understood by reference to the following description of embodiments of the invention taken in conjunction with the accompanying drawings, wherein:

FIG. 1 is a perspective view of a current sensor according to the present invention;

FIG. 3 is a partially exploded perspective view of the items external to the housing of the current sensor of FIG. 1;

FIG. 4(a) is a front elevational view of a conductor of the current sensor of FIG. 1;

FIG. 4(b) is a top plan view of the conductor of FIG. 4(a);

FIG. 5 is a front elevational view of a conductor disposed within a current transducer array assembly including four current transducers and a circuit board according to one embodiment of the present invention;

FIG. 9(a) is perspective view of a double layer, two current transducer array;

FIG. 9(b) is a schematic diagram of the output circuit of the array in FIG. 9(a);

FIG. 10(a) is perspective view of a double layer, four current transducer array;

FIG. 10(b) is a schematic diagram of the output circuit of the array in FIG. 10(a);

FIG. 11 (a) is a perspective view of a double layer, four current transducer array with a balanced output;

FIG. 11(b) is a schematic diagram of the output circuit of the array in FIG. 11(a);

FIG. 12(a) is perspective view of a planar, two transducer array with a balanced output;

FIG. 12(b) is a schematic diagram of the output circuit of the array in FIG. 12(a);

FIG. 13(a) is a perspective view of a planar, four current transducer array with a balanced output;

FIG. 13(b) is a schematic diagram of the output circuit of the array in FIG. 13(a);

FIG. 14(a) is a perspective view of a planar, four current transducer array;

FIG. 14(b) is a schematic diagram of the output circuit of the array in FIG. 14(a);

Figure 2:
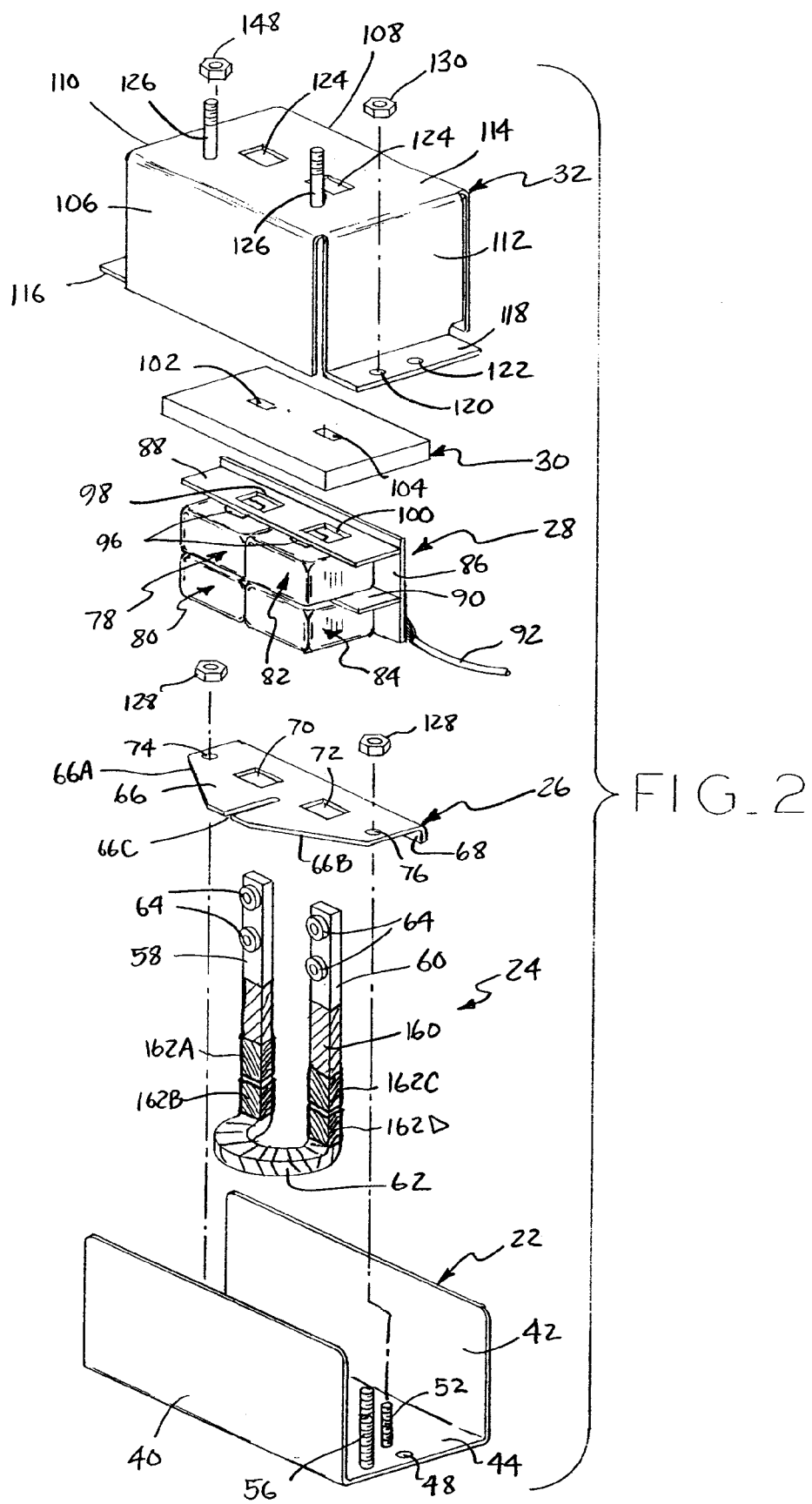
FIG. 2 is a partially exploded perspective view of the items between a base and a housing of the current sensor of FIG. 1.

Corresponding reference characters indicate corresponding parts throughout the several views. Although the drawings represent embodiments of the present invention, the drawings are not necessarily to scale and certain features may be exaggerated in order to better illustrate and explain the present invention.

The embodiments disclosed below are not intended to be exhaustive or limit the invention to the precise forms disclosed in the following detailed description. Rather, the embodiments are chosen and described so that others skilled in the art may utilize their teachings. The exemplifications set out herein illustrate embodiments of the invention, in several forms, and such exemplifications are not to be construed as limiting the scope of the invention in any manner.

DETAILED DESCRIPTION OF THE EMBODIMENTS OF THE INVENTION

In any attempt to reduce noise in a physical system it is always advantageous to have independent samples of the signal which can be summed to increase the net signal. If each of the signals is truly independent, then their noise components will be uncorrelated and will sum as the root of the sum of the squares of each of the noise signals. Ensemble averaging (as this is commonly called) provides a S/N ratio improvement which goes as the square root of the number of signal sources deployed. Therefore, if one were to use two transducers on the same signal the result would be better by 3 dB, four transducers better by 6 dB, etc. Consider the case of using four $7 transducers to replace one $50 transducer. The result is half the noise (−6 dB) for just over half the price.

A smaller transducer with a smaller aperture cannot pass as large a current conductor for a primary. However, this is not a major limitation with current transducer arrays as the current can be divided between the transducers. Thus, small transducers be used in systems for sensing high current. As an example, four 150 A transducers can be used to make a 600 A system.

FIGS. 1 through 5 depict the various components used in one embodiment of a high performance current sensor according to the present invention. As will be further descried below, the current transducer array shown in these figures is just one of many possible arrays. Several other array configurations will be described after the overall structure of a current sensor according to the present invention is described One embodiment of a current sensor 20 according to the present invention is shown fully assembled in FIG. 1 and disassembled in FIG. 2. Referring to these figures, current sensor 20 generally includes a base 22, a conductor 24, a conductor clamp 26, a current transducer assembly 28, a foam insert 30, a housing 32, a housing clamp 34, and conductor extensions 36, 38. Base 22 is generally U-shaped and includes a pair of parallel sidewalls 40, 42 extending perpendicularly from an interconnecting web 44. Base 22 is sized such that sidewall 40 is spaced apart from current transducer assembly 28 (especially the tops of the current transducers). A pair of mounting holes 46, 48 (one shown) extend through web 44. Base 22 further includes a first pair of threaded posts 50, 52 (one shown) extending perpendicularly from web 44 for mounting conductor clamp 26, and a second pair of threaded posts 54, 56 (one shown) extending perpendicularly from web 44 for connecting housing 32 to base 22 as is further described below.

In the embodiment shown, conductor 24 generally includes a pair of parallel legs 58, 60 connected together by a U-shaped portion 62. U-shaped portion 62 is disposed at a right angle relative to legs 58, 60. Each of legs 58, 60 carry a pair of captive nuts 64 adjacent their free ends. Various insulation and shield layers are provided on conductor 24 as is further described below.

Conductor clamp 26 generally includes a plate 66 having a perpendicular stand-off portion 68 along one edge. Plate 66 includes a first pair of openings 70, 72 for receiving conductor legs 58, 60, respectively, and a second pair of openings 74, 76 spaced to align with and receive threaded posts 50, 52, respectively. Plate 66 further includes angled edges 66A, 66B and a slot 66C to improve the effects of interaction between the fields generated by the current transducers of current transducer assembly 28.

Current transducer assembly 28 includes four closed-loop hall effect current transducers 78, 80, 82, 84 mounted to a circuit board 86 which carries a first and a second ferrous magnetic shield 88, 90, respectively. As is further described herein, current transducer assembly 28 may include any number of current transducers arranged in a variety of configurations, each configuration having a corresponding number and arrangement of shields. In this embodiment, current transducers 78, 80, 82, 84 are oriented to result in a cancellation of the fields generated in the X, Y, and Z axes as described below. The size of shields 88, 90 is designed to facilitate the desired field interaction between the coils of current transducers 78, 80, 82, 84. As shown in FIG. 2, neither shield 88, 90 extends from circuit board 86 as far as current transducers 78, 80, 82, 84 extend so as to avoid the coils of the current transducers which are disposed at the outer ends of the transducers. Current transducer assembly 28 further includes a cable 92 connected to circuit board 86 which routes current measurement output signals from current transducers 78, 80, 82, 84 to a connector 94. Each of current transducers 78, 80, 82, 84 includes a central opening 96 for receiving conductor legs 58, 60. Second shield 90 is sized so as to avoid interference with conductor legs 58, 60, but shield current transducers 80, 84 from current transducers 78, 86. First shield 88 includes a pair of openings 98, 100 to receive conductor legs 58, 60, respectively.

Foam insert 30 corresponds approximately in size to current transducer assembly 28. Foam insert 30 includes a pair of openings 102, 104 to receive conductor legs 58, 60, respectively, and insulates current transducer assembly 28 from housing 32 as is further described below.

Housing 32 generally includes a pair of parallel sidewalls 106, 108, a pair of parallel endwalls 110, 112, and an upper wall 114. Sidewalls 106, 108 and endwalls 110, 112 form a box having a substantially rectangular cross-section of sufficient size to enclose conductor 24, conductor clamp 26, current transducer assembly 28, and foam insert 30. Both base 22 and housing 32 are formed of metal such as cold-rolled steel and function to shield the interior components of current sensor 20 from the typical 200 Gauss operating environment. Base 22 and housing 32 tend to align and attenuate the fields from the environment. A pair of flanges 116, 118 extend perpendicularly from endwalls 110, 112, respectively, and each include a first opening 120 positioned to receive one of threaded posts 54, 56, and a second opening 122 which aligns with one of mounting holes 46, 48. Housing upper wall 114 further includes a pair of openings 124 for receiving conductor legs 58, 60 and a pair of threaded posts 126 for mounting housing clamp 34 to housing 32.

As can be seen from FIG. 2, conductor 24 is situated within base 22 such that U-shaped portion 62 sits on base web 44. Conductor clamp 26 is placed onto conductor 24 by passing legs 58, 60 through openings 70, 72. Also, openings 74, 76 receive threaded posts 50, 52 (one shown). Plate 66 rests on U-shaped portion 62 of conductor 24 and stand-off portion 68 rests on base web 44. Stand-off portion 68 is sized such that its vertical dimension is approximately the same as the thickness of U-shaped portion 62. Conductor clamp 26 clamps conductor 24 in place when a pair of nuts 128 are threaded onto threaded posts 50, 52 (one shown) and tightened.

Current transducer assembly 28 is placed onto conductor clamp 26 such that conductor legs 58, 60 pass through central openings 96 of current transducers 78, 80, 82, 84 and openings 98, 100, respectively, of first shield 88. Foam insert 30 is next placed over current transducer assembly 28 such that conductor legs, 58, 60 pass through openings 102, 104, respectively. Foam insert 30 insulates current transducer assembly 28 from housing 32.

Housing 32 is placed over foam insert 30, current transducer assembly 28, conductor clamp 26, and conductor 24 such that conductor legs 58, 60 pass through openings 124, threaded posts 54, 56 pass through openings 120 of flanges 116, 118, and openings 122 align with mounting holes 46, 48 (one shown). Housing 32 is attached to base 22 by threading nuts 130 onto threaded posts 54, 56 (one shown).

Referring now to FIG. 3, housing clamp 34 is shown disassembled and includes a base 132 and a rail 134. Both base 132 and rail 134 may be made of nylon. Base 132 includes three horizontally extending bores 136, two vertically extending slots 138, and two notches 140. Slots 138 are spaced apart so as to receive threaded posts 126, and notches 140 are spaced so as to receive legs 58, 60 of conductor 24. The depth of notches 140 is approximately the same as the thickness of conductor legs 58, 60.

Rail 134 includes three openings 142 which are spaced to align with horizontal bores 136 of base 132. Rail 134 is secured to base 132 by passing bolts 144 through openings 142 and bores 136, and tightening nuts 146 onto the threads of bolts 144. Housing clamp 34 is secured to housing 32 by nuts 148 which are threaded onto posts 126.

Extension 36 for the sensory primary current includes a pair of holes 150 which align with captive nuts 64 of leg 58. Extension 36 is attached to leg 58 by passing fasteners 152 through holes 150 and threading fasteners 152 into captive nuts 64. Similarly, extension 38 includes openings 154 which align with captive nuts 64 of leg 60 and receive fasteners 156 to attach extension 38 to leg 60.

Referring now to FIGS. 4(a) and 4(b), the entire area of conductor 24 below captive nuts 64 is covered or wrapped with a first insulation layer 158 using, for example, kapton tape. A shield layer 160 is wrapped over insulation layer 158 using, for example, a copper foil tape with Mylar insulation. It should be understood that shield layer 160 does not contact conductor 24. Finally, the four areas of legs 58, 60 which will pass through and be surrounded by current transducers 78, 80, 82, 84 are covered by or wrapped with a second insulation layer 162a 162b, 162c, 162d, respectively, using, for example, glass cloth insulation tape.

FIG. 5 shows a partially assembled current sensor 20 with base 22, housing 32, housing clamp 34, and extensions 36, 38 removed.

In operation, current sensor 20 is placed in a device with the current flow path for the device routed through conductor 24. Current sensor 20 is mounted to the device with fasteners that extend through mounting holes 46, 48 in base 22, and openings 122 in housing 32. As the current flows through conductor 24, current transducers 78, 80, 82, 84 sense the current and output a signal through circuit board 86 to cable 92 and connector 94. Connector 94 is typically connected to a current monitor and control device.

Figure 6:
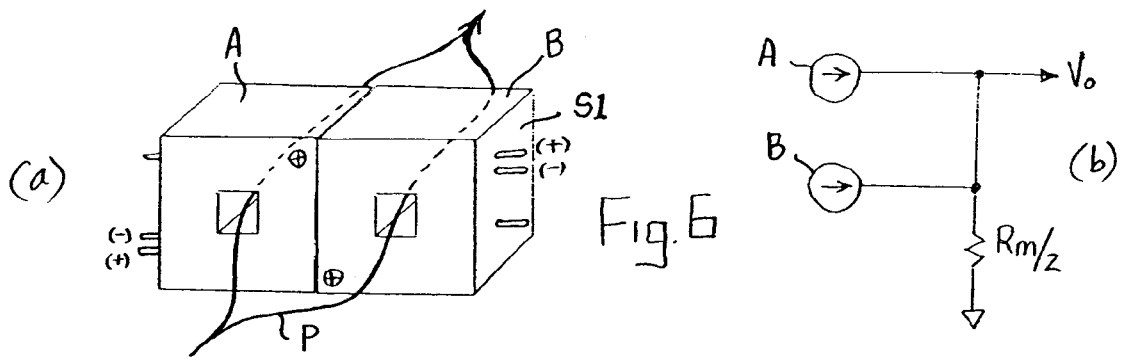
FIG. 6(a) is perspective view of a single layer, two current transducer array.
FIG. 6(b) is a schematic diagram of the output circuit of the array in FIG. 6(a)
Figure 7:
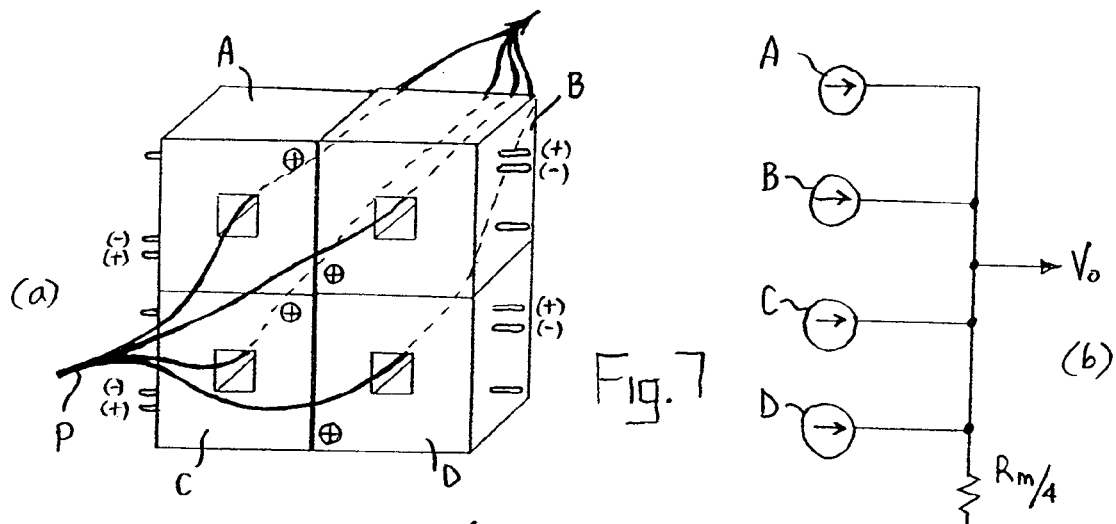
FIG. 7(a) is a perspective view of a single layer, four current transducer array.
FIG. 7(b) is a schematic diagram of the output circuit of the array in FIG. 7(a)
Figure 8:
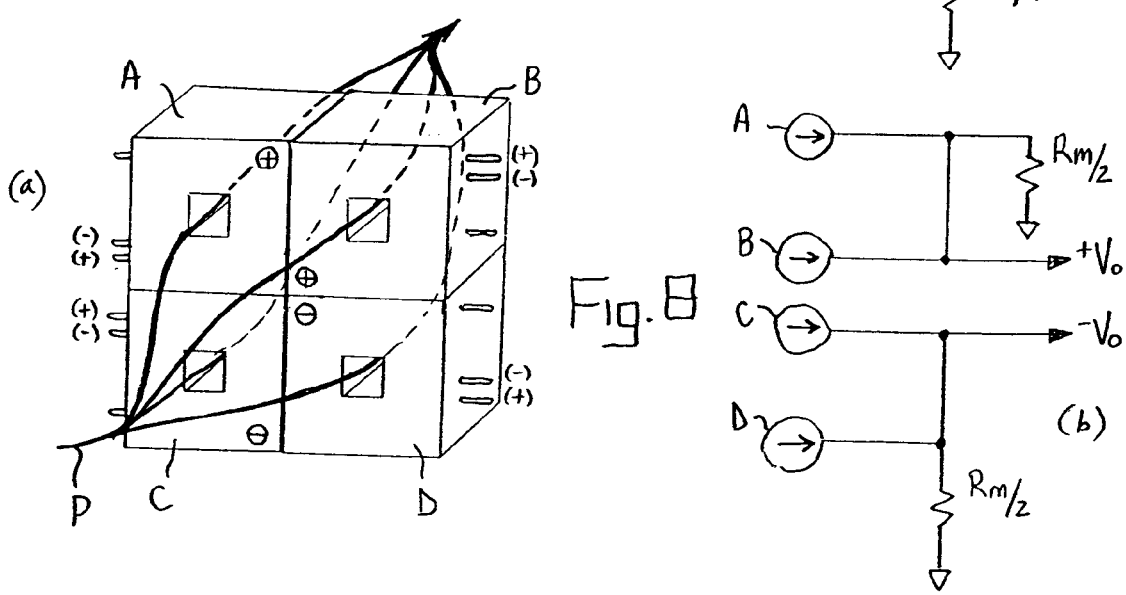
FIG. 8(a) is a perspective view of a single layer, four current transducer array with a balanced output.
FIG. 8(b) is a schematic diagram of the output circuit of the array in FIG. 8(a)

FIGS. 6 through 8 show single layer, multi-current transducer arrays. FIG. 6(a) is the simplest configuration wherein the current carried by the primary lead for sensing high current, represented by arrow P, is split in half and routed through two current transducers A, B which are rotated such that one is 180 degrees relative to the other. A simple 180 degree rotation causes the stray field response of current transducer B to be inverted from that of current transducer A for its X and Y axes. The X axis is taken to be the axis parallel to the traditional mounting surface (e.g., circuit board 86) through which the transducer leads protrude. In other words, the X axis is parallel to the surface S1 shown in FIG. 6 (not shown in FIGS. 7–15). The Y axis is perpendicular to surface S1. The Z axis is parallel with primary lead P passing through the central opening 96 of current transducers A, B.

Traditionally the X and Y axis responses are the major stray field response directions. The Z axis is generally least susceptible. Therefore, the simple 180 degree rotation which inverts both X and Y axes, creates an auto-canceling stray field configuration.

FIG. 6(b) is the output connection circuit of the array in FIG. 6(a). As shown, the outputs of transducers A, B are added together. This combined output is carried by cable 92 to connector 94 to the electrical device which includes resistance Rm/2. Since the stray field terms cancel and the signal sums in this circuit, it is evident that stray field has been drastically (~20 dB) improved and the S/N ratio has been improved by 3 dB (the square root of two). The resultant sensor is a 300 A sensor, if two 150 A current transducers are used. Additionally, drift is minimized if transducers A, B are graded for drift of equal magnitude, but opposite sign, and are combined in the configuration of FIG. 6(a).

The configuration in FIG. 7(a) shows one way to double the size of the array and accommodate primary currents which are divided by four before being routed through the four current transducers A, B, C, D in this configuration. FIG. 7(b) is the output connection circuit of the array in FIG. 7(a). The S/N ratio improves by 6 dB and the drift coefficients are graded and selected such that the sum of the four is zero.

The configuration in FIG. 8(a) gives the same performance sum-total as 7(a) but the output voltage is doubled. FIG. 8(b) is the output connection circuit of the array in FIG. 8(a). In many cases the signal is received by a balanced input receiver for immunity to ground loops. This does not impose any constraints on the construction to use this configuration. Drift coefficients are selected such that the sum for transducers A and B is equal to the sum for transducers C and D.

FIGS. 9 through 11 depict double layer current transducers which provide improved S/N ratio without requiring the increases in full-scale current associated with the arrays of the earlier figures. The primary passes directly through both layers. The configuration in FIG. 9(a) has no current division, but again uses the 180 degree rotation method for field cancellation. FIG. 9(b) is the output connection circuit of the array in FIG. 9(a) and is identical to that of FIG. 6(b). A S/N ratio improvement of 3 dB with X and Y axis susceptibility field improvement is the result of this configuration.

The configuration in FIG. 10(a) provides a factor of two current doubling along with 6 dB of S/N ratio improvement. FIG. 10(b) is the output connection circuit of the array in FIG. 10(a).

The array of FIG. 11(a) inverts (flips over) current transducers C and D of FIG. 10(a) and produce a balanced output. FIG. 11(b) is the output connection circuit of the array in FIG. 11(a). Note that X and Y axis field canceling occurs in the individual pairs of transducers (A and B, and C and D) without the need of any other pairing. In this case, the drift selection process requires only that the sum of the drift terms of current transducers A and B be set equal to the sum of the terms of transducers C and D as had occurred in the configuration of FIG. 8(a). Either mini-sum may be non-zero.

It should be understood that the methods of FIGS. 9 through 11 can be extended to any number of layers to increase the S/N ratio, if so desired.

FIGS. 12 through 14 show arrays having primary conductors 24 which enter and exit on the same side of the array. Currents which enter on the left, exit on the right and vice versa. This is advantageous for packaging. This type of array is referred to as a planar array.

FIG. 12(a) shows the simplest configuration with no current division. FIG. 12(b) is the output connection circuit of the array in FIG. 12(a). Both stray field outputs are canceled electrically by the balanced output. For this reason, current transducers A, B are mounted with the same orientation. In this case, even the Z axis response is canceled. The S/N ratio improves by 3 dB, and the drift coefficients should be matched.

The configuration in FIG. 13(a) shows a planar array having a factor of two current division. FIG. 13(b) is the output connection circuit of the array in FIG. 13(a). Four way cancellations are in effect here with transducer A canceling transducer C in the X and Y axes, as transducer B cancels transducer D in the X and Y axes. Transducer A also cancels transducer B for the X, Y, and Z axes, while transducer C cancels transducer D for the X, Y, and Z axes. The S/N ratio increases by 6 dB. The sum of the drift coefficients of transducers A, C and transducers B, D match for zero drift.

The configuration in FIG. 14(a) has many of the cancellations of FIG. 13(a) but they all are effected without a balanced output. FIG. 14(b) is the output connection circuit of the array in FIG. 14(a). The S/N ratio increases by 6 dB, and the drift coefficients must now sum to zero.

All of the basic array configurations are illustrated in FIGS. 6 through 14. Clearly some of them can be combined to result in the mix of features most desired.

Figure 15:
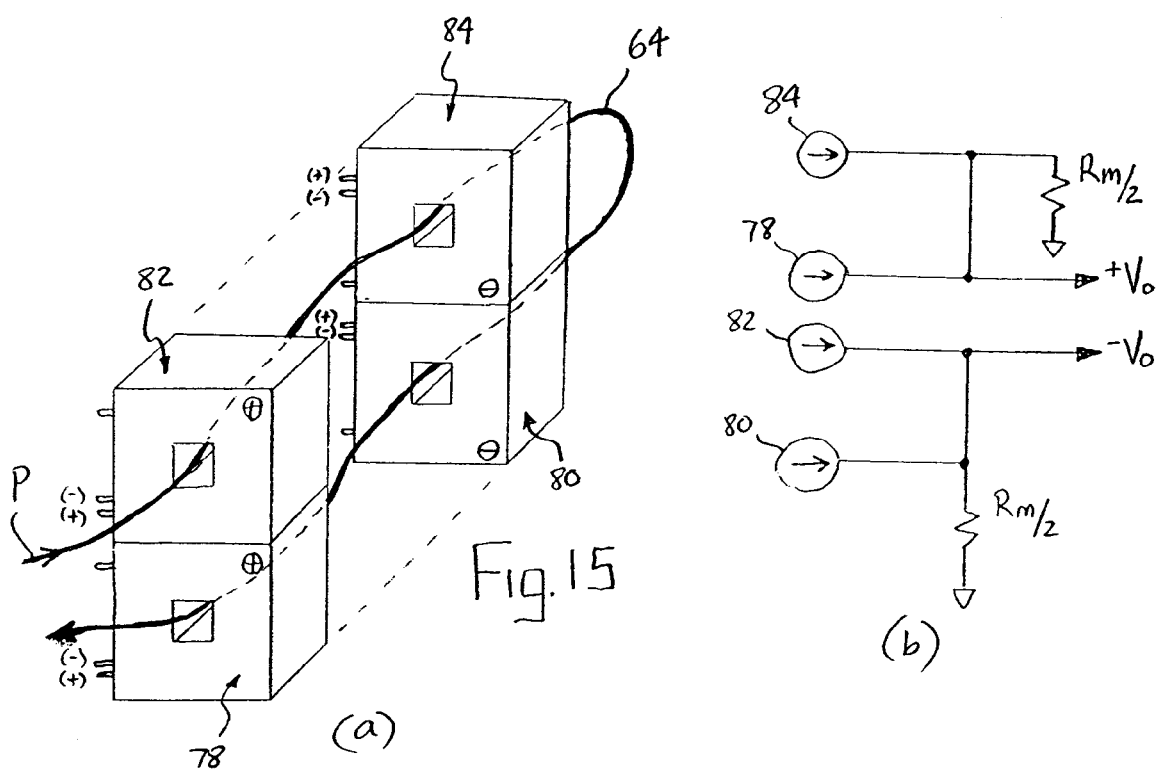
FIG. 15(a) is a perspective view of another double layer, four transducer array with a balanced output.
FIG. 15(b) is a schematic diagram of the output circuit of the array in FIG. 15(a)

FIG. 15 shows an array configuration corresponding to the sensor embodiment depicted in FIGS. 1–5. As shown, transducer 82 is stacked on transducer 84, and is rotated 180 degrees relative to transducer 84 about its Y axis. Transducers 78 and 80 are similarly arranged. Current carried by conductor 64 passes through transducers 82, 84, 80, 78, respectively. It should be understood that transducers 84 and 78 are electrically connected together by circuit board 86, and transducers 82, 80 are electrically connected. FIG. 15(b) shows the output connection circuit.

Faraday shields (such as shield 160 of FIG. 2) are used within the current transducer assemblies to keep RF out of the transducers. Conductive sleeves (such as shield layer 160 of FIGS. 4 and 5) are added around each of the primary leads of the current sensor. The cost of this construction is minimal as foil and cardboard tubes are all workable materials.

The frequency response errors of the above-described arrays are repeatable, allowing for a fixed compensation correction in the system in which they are deployed. A drift canceling circuit could also be used in the system. Drift measuring is typically done by placing an ordered tray of units (operating) into a controlled temperature oven. The offset is recorded at two or more temperatures as the units are heated from room temperature to about 50 degrees C. The heating of the current transducers can be expedited by stirring the oven air. This is all a slow process expected to require about 30 minutes per load. The trays hold a large quantity of devices for throughput purposes.

An example of a possible design, where 200 A+ of full-scale output is measured, is described below. The arrays in FIG. 11(a) or 13(a) would both meet this requirement with a 6 dB S/N ratio improvement. Using four Nana FA150 Hall current sensors as current transducers A, B, C, D, the terminating Rm/2 resistor could be 25 ohms (Rm=50 ohms) resulting in a net balanced output voltage of 7.5 volts at 300 A, more than adequate headroom. The noise currents being uncorrelated increase the noise voltage across each output node by 3 dB, but the halving of Rm cuts the voltage by 6 dB. Thus, noise from each output is down 3 dB from a single current transducer design driving Rm. The balanced output provides 6 dB more signal, but noise only adds for 3 dB of the increase. Adding all of the factors, the noise voltage is equal to the original simple case, but the signal voltage is doubled (balanced out). Thus, the assertion that there has been a 6 dB S/N ratio increase is verified. In this situation, the entire 6 dB of S/N ratio enhancement has gone into increased headroom. Normally, increasing the headroom directly increases the noise floor by an identical ratio. A typical noise floor would be ~300 µArms (10 Hz to 10 KHz).

Some creativity is needed for making the current division process reasonably accurate. However, it does not need to be perfect as the sum is always correct. The accuracy of balance of the currents improves the headroom of the system. In order to balance a divided current, controlled impedances are designed into the bussing structure. The controlled impedances dominate the uncontrolled joint or connection impedances. Some anticipated methods include the following:

1. Using a minimal cross-section of copper buss bar for the current transducer primaries or using a larger cross-section of a well behaved alloy of brass. This being the controlled portion of the impedances.
2. A simple J-shaped buss geometry for non-planar arrays allows identical parts to mate and join from opposite sides of the outer enclosure. Bolts (screws) are driven into the short leg of the J using captive nuts.
3. Using Belleville washers to spread force and increase the joint area under each fastener.
4. The use of many smaller, fine-thread fasteners provides more surface clamping force than one larger fastener. The redundant character of the joint also improves reliability.
5. Cleaning all joints before assembly and using an anti-oxidant in the joints.
6. Clamping a soft metal wafer, such as solder, in the joints to make the contact area more uniform and repeatable.
7. Clamping the buss bar that passes through the current transducers from both sides to maximize the contact area. The second part of this double surface contact can be welded or silver soldered to the first part.
8. Deliberately maximizing the length of the controlled portions of the construction. This improves their cooling to contain the added resistive heating.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A current sensor for an electrical device comprising:
   a conductor adapted to be connected in a current path of said electrical device;
   at least two current transducers coupled to said conductor, each of said current transducers having an output lead; and
   a current level signal generated by said current transducers and provided on said output leads;
   wherein said conductor is U-shaped and includes two legs and a rounded center portion, said center portion being disposed at a right angle to said legs.

2. The sensor of claim 1, wherein said at least two current transducers is a single layer array.

3. The sensor of claim 1, wherein said at least two current transducers is a multiple layer array.

4. The sensor of claim 1, wherein said at least two current transducers is a planar array.

5. The sensor of claim 1, wherein at least one of said current transducers is oriented relative to said conductor differently from the other current transducers.

6. The sensor of claim 1, further comprising a plurality of shields positioned adjacent said current transducers.

7. The sensor of claim 1, where each of said at least two current transducers comprises a Hall-effect sensors.

8. The sensor of claim 7, where said Hall-effect sensors are closed-loop.

9. The sensor of claim 1, comprising a printed circuit board, where said at least two current transducers is affixed to said printed circuit board.

10. A current sensor for an electrical device comprising:
    a conductor adapted for coupling in a current path of said electrical device;
    a first current transducer having an axial passage formed to receive said conductor and configured to measure a current flowing in said conductor; and
    a second current transducer having an axial passage formed to receive said conductor and configured to measure said current flowing in said conductor;
    where said second current transducer is adjacent to and rotated about 180 degrees with respect to said first current transducer to automatically reduce effects from stray fields.

11. The sensor of claim 10, where said first and second current transducers comprise Hall-effect sensors.

12. The sensor of claim 10, where said Hall-effect sensors are closed-loop.

13. The sensor of claim 10, comprising a ferrous magnetic shield positioned between said first current transducer and said second current transducer.

14. The sensor of claim 10, comprising a housing, where said housing comprising a conductive ferrous metal.

15. The sensor of claim 10, comprising a printed circuit board where said first current transducer and said second current transducer are each affixed to said printed circuit board.

16. The sensor of claim 10, where said conductor comprises a first conductor and a second conductor, said first and second conductors extend longitudinally and are arranged in parallel, said axial passage of said first current transducer is formed to receive said first conductor, and said axial passage of said second current transducer is formed to receive said second conductor.

17. The sensor of claim 10, where said conductor comprises a U-shaped portion having a first leg and a second leg, and said axial passage of said first current transducer is formed to receive said first leg and said axial passage of said second current transducer is formed to receive said second leg.

18. The sensor of claim 17, comprising a ferrous magnetic shield having a first and a second aperture, where said ferrous magnetic shield is positioned adjacent to said first current transducer and said second current transducer such that said first aperture of said ferrous magnetic shield is axially aligned with said axial passage of said first current transducer and said second aperture of said ferrous magnetic shield is axially aligned with said axial passage of said second current transducer.

19. The sensor of claim 18, where said first current transducer and said second current transducer each has a surface surrounding an entrance to said respective axial passage, and said ferrous magnetic shield obstructs approximately half of each surface.

20. The sensor of claim 10, comprising a Faraday shield positioned in said axial passage of said first current transducer between said conductor and said first current transducer.

21. The sensor of claim 10, where said first current transducer and said second current transducer are substantially electrically identical.

22. A current sensor for an electrical device comprising:
- a conductor adapted for coupling in a current path of said electrical device, where said current path has a forward direction;
- a first current transducer having an axial passage formed to receive said conductor, where said first current transducer is positioned to generate a positive signal for a current flowing in said forward direction;
- a second current transducer having an axial passage formed to receive said conductor, where said second current transducer is positioned adjacent to said first current transducer and positioned to generate a negative signal for said current flowing in said forward direction; and
- a circuit coupled to said first current transducer and to said second current transducer, where said circuit is configured to generate a current level signal indicative of current flow in said current path as a function of said positive signal and said negative signal.

23. The sensor of claim 22, where said circuit comprises a combining circuit that combines said positive signal with a polar reverse of said negative signal to produce said current level signal.

24. The sensor of claim 22, where said first and second current transducers comprise Hall-effect sensors.

25. The sensor of claim 24, where said Hall-effect sensors are closed-loop.

26. The sensor of claim 22, where said conductor comprises a U-shaped portion.

27. The sensor of claim 26, where said conductor comprises a U-shaped portion having a first leg and a second leg, said axial passage of said first current transducer is formed to receive said first leg and said axial passage of said second current transducer is formed to receive said second leg.

28. The sensor of claim 22, comprising:
- a third current transducer having an axial passage formed to receive said conductor, where said third current transducer is positioned adjacent to said second current transducer and positioned to generate a second positive signal for said current flowing in said forward direction; and
- a fourth current transducer having an axial passage formed to receive said conductor, where said fourth current transducer is positioned adjacent to said first and third current transducers, and positioned to generate a second negative signal for said current flowing in said forward direction;
- where said circuit is coupled to said third current transducer and to said fourth current transducer and is configured to generate a current level signal indicative of current flow in said current path as a function of said second positive signal and said second negative signal.

29. The sensor of claim 28, comprising a circuit board, where said first, second, third and fourth current transducers are affixed to said printed circuit board.

* * * * *